(12) United States Patent
Nozaki et al.

(10) Patent No.: US 6,524,894 B1
(45) Date of Patent: Feb. 25, 2003

(54) SEMICONDUCTOR DEVICE FOR USE IN POWER-SWITCHING DEVICE AND METHOD OF MANUFACTURING THE SAME

(75) Inventors: Hideki Nozaki, Kawasaki (JP); Yoshiro Baba, Yokohama (JP); Motoshige Kobayashi, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/783,303

(22) Filed: Feb. 15, 2001

(30) Foreign Application Priority Data

Feb. 16, 2000 (JP) .......................... 2000-038469

(51) Int. Cl.[7] ................. H01L 21/332; H01L 29/74; H01L 31/111
(52) U.S. Cl. .............. 438/138; 438/137; 438/268; 438/273; 438/309; 438/311; 438/331; 257/135; 257/328; 257/368; 257/370; 257/392
(58) Field of Search .................. 257/135, 328, 257/368–370, 378, 392, 393; 438/137, 138, 212, 268–270, 273, 274, 311, 309, 318, 331, 343, 338

(56) References Cited

U.S. PATENT DOCUMENTS

| 5,025,293 | A |   | 6/1991 | Seki |
| 5,668,385 | A |   | 9/1997 | Bauer et al. |
| 5,723,349 | A |   | 3/1998 | Fallica |
| 6,236,069 | B1 | * | 5/2001 | Shinohe et al. ............. 257/138 |

* cited by examiner

Primary Examiner—Wael Fahmy
Assistant Examiner—Hsien-Ming Lee
(74) Attorney, Agent, or Firm—Finnegan, Henderson, Farabow, Garrett & Dunner, L.L.P.

(57) ABSTRACT

An $N^+$ buffer layer formed on the underside of an $N^-$ layer includes an inactive region having incompletely activated ions and an active region having highly activated ions. The carrier concentration of the active region is higher than that of the inactive region. In the inactive region, the electrical activation rate X of the ions is expressed as $1\% \leq X \leq 30\%$. It is thus possible to achieve a PT structure using a Raw wafer, which reduces manufacturing costs and suppresses power consumption.

25 Claims, 8 Drawing Sheets

SEMICONDUCTOR DEVICE FOR USE IN POWER-SWITCHING DEVICE AND METHOD OF MANUFACTURING THE SAME

CROSS-REFERENCE TO RELATED APPLICATIONS

This application is based upon and claims the benefit of priority from the prior Japanese Patent Application No. 2000-038469, filed Feb. 16, 2000, the entire contents of which are incorporated herein by reference.

BACKGROUND OF THE INVENTION

The present invention relates to a semiconductor device for use in a power-switching device such as an insulated gate bipolar transistor (IGBT) and a power MOSFET and a method of manufacturing the same.

A semiconductor device having a punch-through structure (referred to as a PT structure hereinafter) is generally used in a power-switching device. If the power-switching device is an IGBT, the PT structure causes an $N^-$ layer to be completely depleted when the highest voltage is applied to the IGBT.

Figure 12:
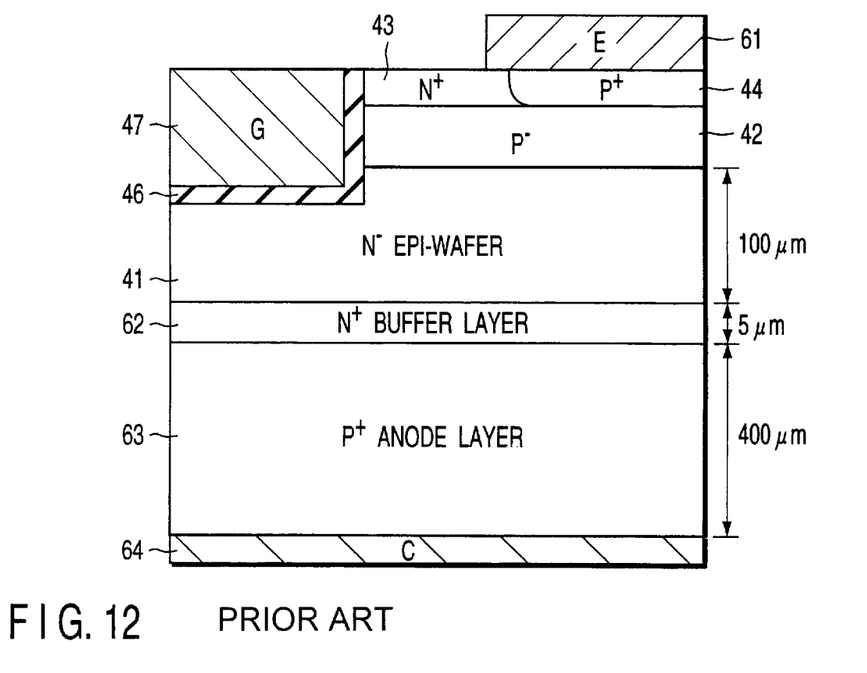
FIG. 12 is a cross-sectional view showing a prior art IGBT having a PT structure.

FIG. 12 exemplifies an IGBT having a PT structure. As FIG. 12 shows, a $P^-$-type diffusion layer 42 is formed on the surface of an $N^-$ layer 41 formed by epitaxial growth (hereinafter referred to as an $N^-$ epi-wafer), and an $N^+$-type diffusion layer 43 and a $P^+$-type diffusion layer 44 are formed on the layer 42. A gate electrode 47 is formed in the $N^-$ epi-wafer 41 with a gate insulation film 46 interposed therebetween, and an emitter electrode 61 is selectively formed above the $N^-$ epi-wafer 41. Furthermore, an $N^+$-type buffer layer 62 (referred to as an $N^+$ buffer layer hereinafter) is formed on the underside of the $N^-$ epi-wafer 41, and a $P^+$-type anode layer 63 (referred to as a $P^+$ anode layer hereinafter) is formed on the underside of the layer 62. A collector electrode 64 is also formed on the underside of the $P^+$ anode layer 63. If the IGBT is a product having a withstanding voltage of 1200V, the thickness of the $N^-$ epi-wafer 41 is 100 μm, that of the $N^+$ buffer layer 62 is 5 μm, and that of the $P^+$ anode layer 63 is 400 μm.

In the IGBT having such a PT structure, a depletion layer grows from the $P^-$-type diffusion layer 42 to the $N^-$ epi-wafer 41 when a switch is off. The $N^+$ buffer layer 62 suppresses the growth of the depletion layer and prevents the depletion layer from contacting the $P^+$ anode layer 63.

Since the IGBT includes the $P^+$ anode layer 63, a number of holes are implanted into the $N^-$ epi-wafer 41 from the $P^+$ anode layer 63, thereby increasing an energy loss when the switch is off (referred to as Eoff hereinafter). In order to reduce the Eoff, the $N^+$ buffer layer 62 having a thickness of 5 μm or more is provided, and an electron beam and a photon radiation are emitted to cause crystal defects.

However, a wafer used in the PT structure corresponds to the $N^-$ epi-wafer 41 that grows epitaxially. The IGBT having a PT structure therefore has the problem that the manufacturing cost of the wafer is high.

A Raw wafer, which is not processed, can be considered to be an inexpensive wafer used in place of the epi-wafer 41, and an IGBT having a non-punch-through structure (referred to as an NPT structure hereinafter) using the Raw wafer is realized. The NPT structure causes an $N^-$ layer to be depleted only 70% to 80% when the highest voltage is applied to the IGBT, unlike the PT structure.

Figure 13:
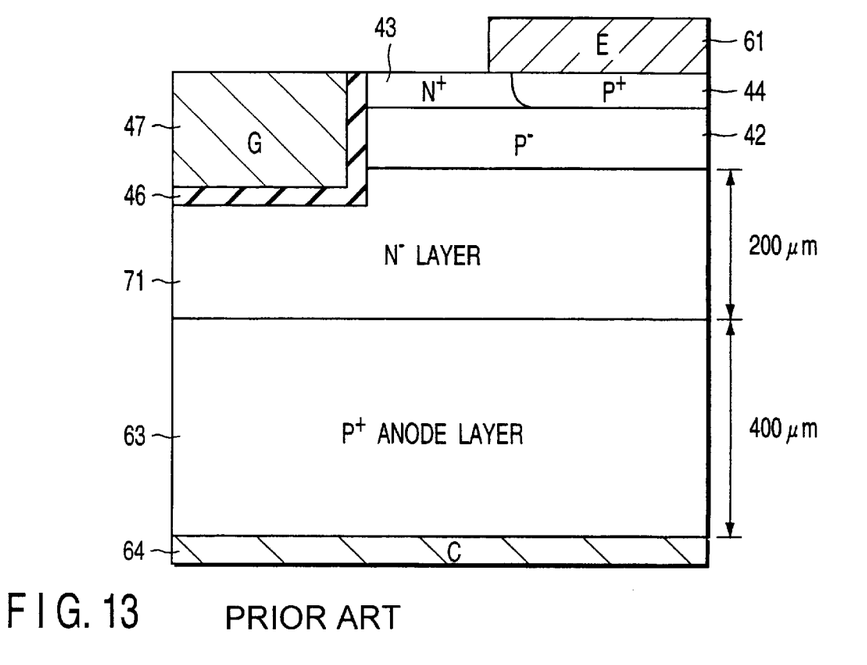
FIG. 13 is a cross-sectional view showing a prior art IGBT having an NPT structure.

FIG. 13 exemplifies an IGBT having an NPT structure. In FIG. 13, the same constituting elements as those of the IGBT having a PT structure shown in FIG. 12 are indicated by the same reference numerals.

In the NPT structure, an $N^-$ layer 71 is formed in place of the $N^-$ epi-wafer 41 and the $N^+$ buffer layer 62 of the PT structure. If the IGBT is a product having a withstanding voltage of 1200V, the thickness of the $N^-$ layer 71 is 200 μm and that of the $P^+$ anode layer 63 is 400 μm. In the IGBT shown in FIG. 13, the constituents other than the $N^-$ layer 71 are the same as those of the IGBT shown in FIG. 12 and thus their descriptions are omitted.

In the IGBT having an NPT structure, the $N^-$ layer 71 should be formed up to such a desired thickness as to prevent a depletion layer, which expands when the highest voltage is applied to the IGBT, from reaching a collector electrode 64. More specifically, if the IGBT is a product having a withstanding voltage of 1200V, the thickness of the $N^-$ layer 71 should be 200 μm to obtain a cutoff voltage when a switch is off, whereas in the PT structure the thickness of the $N^-$ epi-wafer 41 has only to be about 100 μm. In other words, the NPT structure necessitates an $N^-$ layer which is twice as thick as that of the PT structure in order to create the same withstanding voltage. The NPT structure therefore has the problem that power consumption increases more greatly than that in the PT structure when a switch is on.

One therefore requires that an IGBT (not shown) having a PT structure using a Raw wafer be realized and, in other words, one requires an IGBT in which an $N^+$ buffer layer and a $P^+$ anode layer are formed on the underside of a Raw wafer. The PT structure using a Raw wafer decreases a manufacturing cost and produces a device that can suppress power consumption more greatly than that having an NPT structure. The $N^+$ buffer layer should be formed up to such a thickness that a depletion layer is stopped from reaching an anode layer by a reverse withstanding voltage to create a device withstanding voltage and reduce the Eoff.

In the IGBT having a PT structure using a Raw wafer, however, a surface structure (a $P^+$-type diffusion layer, etc.) of the wafer is difficult to form after the wafer is thinned. Thus, after the surface structure of the wafer is formed, the wafer is thinned and then the underside structure (an $N^+$ buffer layer, etc.) is formed by ion implantation, annealing and the like. Taking into consideration that heat damage is caused to the surface of the wafer, there is a limit to diffusion temperatures. In other words, it was difficult to form an $N^+$ buffer layer having a thickness (e.g., 5 μm or more) necessary for generating a device withstanding voltage and reducing the Eoff. It has been therefore thought that an IGBT having a PT structure using a Raw wafer is difficult to achieve.

As described above, the IGBT having a PT structure using an epi-wafer has the problem that the epi-wafer increases in manufacturing cost. The IGBT having an NPT structure using a Raw wafer has the problem that power consumption increases when a switch is on.

Furthermore, the IGBT having a PT structure using a Raw wafer, which is proposed to overcome the above problems, has the problem that an $N^+$ buffer layer having a desired thickness is difficult to form because heat damage is caused to the surface and restricts the formation of an underside structure.

Consequently, it is difficult to form an IGBT capable of reducing in manufacturing cost and suppressing power consumption.

BRIEF SUMMARY OF THE INVENTION

The present invention has been developed in order to resolve the above problems and its object is to provide a semiconductor device capable of reducing manufacturing costs and suppressing power consumption and a method of manufacturing the same.

To attain the above object, the present invention has the following structures:

A first semiconductor device of the present invention comprises a first diffusion region of a second conductivity type formed on a surface of a semiconductor substrate of a first conductivity type, a second diffusion region of the first conductivity type selectively formed on a surface of the first diffusion region, a gate electrode formed in or on the semiconductor substrate with a gate insulation film interposed therebetween, an emitter electrode electrically insulated from the gate electrode and selectively formed on the semiconductor substrate, an inactive region of the first conductivity type formed on an underside of the semiconductor substrate, the inactive region having incompletely activated ions, an active region of the first conductivity type formed on an underside of the inactive region, the active region having highly activated ions, an anode layer of the second conductivity type formed on an underside of the active region, and a collector electrode formed on an underside of the anode layer.

A second semiconductor device of the present invention comprises a first diffusion region of a second conductivity type formed on a surface of a semiconductor substrate of a first conductivity type, a second diffusion region of the first conductivity type selectively formed on a surface of the first diffusion region, a gate electrode formed in or on the semiconductor substrate with a gate insulation film interposed therebetween, a source electrode electrically insulated from the gate electrode and selectively formed on the semiconductor substrate, an inactive region of the first conductivity type formed on an underside of the semiconductor substrate, the inactive region having incompletely activated ions, an active region of the first conductivity type formed on an underside of the inactive region, the active region having highly activated ions, and a drain electrode formed on an underside of the active region.

A third semiconductor device of the present invention comprises a first diffusion region of a second conductivity type formed on a surface of a semiconductor substrate of a first conductivity type, a second diffusion region of the first conductivity type selectively formed on a surface of the first diffusion region, a gate electrode formed in or on the semiconductor substrate with a gate insulation film interposed therebetween, a source electrode electrically insulated from the gate electrode and selectively formed on the semiconductor substrate, an inactive region of the first conductivity type formed on an underside of the semiconductor substrate, the inactive region having incompletely activated ions, and a drain electrode formed on an underside of the inactive region.

In the first to third semiconductor devices, the electrical activation rate X of the ions of the inactive region is expressed as $1\% \leq X \leq 30\%$.

In the first to third semiconductor devices, the integrated carrier concentration Y of the inactive region is expressed as $1 \times 10^{12}/cm^2 \leq Y \leq 1 \times 10^{15}/cm^2$.

In the first semiconductor device, the carrier concentration of the active region is higher than that of the inactive region, and a carrier concentration of the anode layer is higher than that of the active region. The ratio Z of carrier concentration of the anode layer to that of the active region is given by $1 < Z < 100$.

In the second semiconductor device, the carrier concentration of the active region is higher than that of the inactive region.

A method of manufacturing a semiconductor device of the present invention, comprises the steps of forming a first diffusion region of a second conductivity type on a surface of a semiconductor substrate of a first conductivity type, selectively forming a second diffusion region of the first conductivity type on a surface of the first diffusion region, forming a gate electrode in or on the semiconductor substrate with a gate insulation film interposed therebetween, selectively forming an emitter electrode on the semiconductor substrate, polishing an underside of the semiconductor substrate, forming an active region of the first conductivity type on the underside of the semiconductor substrate and an anode layer of the second conductivity type on an underside of the active region by heat treatment after ions are implanted into the underside of the semiconductor substrate, the active region having highly activated ions, forming a collector electrode on an underside of the anode layer after the ions are implanted into the underside of the semiconductor substrate, and forming an inactive region of the first conductivity type between the semiconductor substrate and the active region by heat treatment, the inactive region having incompletely activated ions.

The present invention thus provides a semiconductor device capable of reducing manufacturing costs and suppress power consumption and a method of manufacturing the same.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

[First Embodiment]

The first embodiment of the present invention is directed to an insulated gate bipolar transistor (IGBT) having a punch-through structure (referred to as a PT structure hereinafter) using a Raw wafer and characterized in that the IGBT has two $N^+$ buffer layers having different carrier concentrations.

Figure 1A:
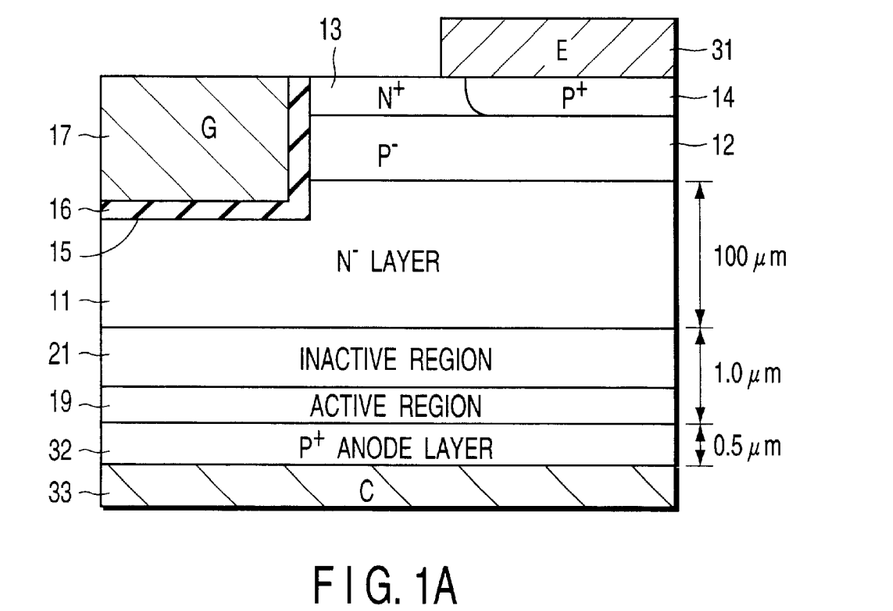
FIG. 1A is a cross-sectional view showing a trench IGBT according to a first embodiment of the present invention.

FIG. 1A is a cross-sectional view of a trench IGBT according to the first embodiment of the present invention. Referring to FIG. 1A, a method of forming the IGBT will be discussed.

First, a $P^+$-type diffusion layer 12 is formed on the surface of an $N^-$-type silicon substrate 11 (referred to as an N layer hereinafter) serving as a Raw wafer, and an $N^+$-type diffusion layer 13 and a $P^+$-type diffusion layer 14 are selectively formed on the surface of the layer 12. Then, a trench 15 is formed to such a depth as to reach the $N^-$ layer 11. A gate insulation film 16 is formed on the entire surface of the resultant structure, and a metal film is formed on the gate insulation film 16. After that, both the gate insulation film 16 and the metal film are selectively removed, and a gate electrode 17 is formed by the gate insulation film 16 in the trench 15. Then, an emitter electrode 31, which is electrically insulated from the gate electrode 17, is selectively formed above the $N^-$ layer 11. The formation of the surface structure of the wafer is thus completed.

The underside of the wafer is polished to have a given thickness corresponding to a withstanding voltage of the device. In order to set the withstanding voltage of the device to, e.g., 1200V, the underside of the wafer is polished such that the $N^-$ layer 11 has a thickness of 100 μm.

Phosphorus is ion-implanted into the underside of the wafer at an acceleration voltage of 100 keV and a dose of $5\times10^{13}/cm^2$. Boron is then ion-implanted thereinto at an acceleration voltage of 50 KeV and a dose of $3\times10^{14}/cm^2$. After that, the resultant structure is thermally treated at a temperature of 900° C. by rapid thermal annealing (RTA) to activate the ions. Thus, an activated $N^+$ buffer layer 19 having a thickness of 0.4 μm (referred to as an active region hereinafter) and a $P^+$-type anode layer 32 having a thickness of 0.5 μm (referred to as a $P^+$ anode layer hereinafter) are formed on the underside of the wafer. The activation rate of the active region 19 need not be 100% but can be about 70%, for example.

Phosphorus is then ion-implanted into the underside of the wafer at an acceleration voltage of 500 keV and a dose of $1\times10^{14}/cm^2$. A collector electrode 33, which is made of a metal film, is formed on the underside of the $P^+$ anode layer 32. After that, the resultant structure is thermally treated at a temperature of 500° C. to activate the ions. Thus, an incompletely activated $N^+$ buffer layer 21 (referred to as an inactive region hereinafter) is formed between the $N^-$ layer 11 and the active region 19. The electrical activation rate of ions in the inactive region 21 is about 10%, for example.

The $N^+$ buffer layer constituted of the active region 19 and the inactive region 21 has a thickness of about 1.0 μm, while the $P^+$ anode layer 32 has a thickness of about 0.5 μm. In contrast, in the conventional PT structure using a Raw wafer, the thickness of the $N^+$ buffer layer is 5 μm or more, and that of the $P^+$ anode layer is 400 μm. In other words, the first embodiment allows the $N^+$ buffer layers 19 and 21 and the $P^+$ anode layer 32 to be thinned more greatly than the conventional PT structure using a Raw wafer. The $N^+$ buffer layers 19 and 21 and $P^+$ anode layer 32 of the first embodiment can thus be formed by heat treatment in a short time. Even though the underside of the wafer is heat-treated after the surface structure thereof is formed, no heat damage is caused to the surface of the wafer. If the total thickness of the $N^+$ buffer layers 19 and 21 is 3.0 μm or less, no heat damage is caused to the surface of the wafer.

The IGBT according to the first embodiment is not limited to a trench gate electrode but can be a planar gate electrode.

Figure 1B:
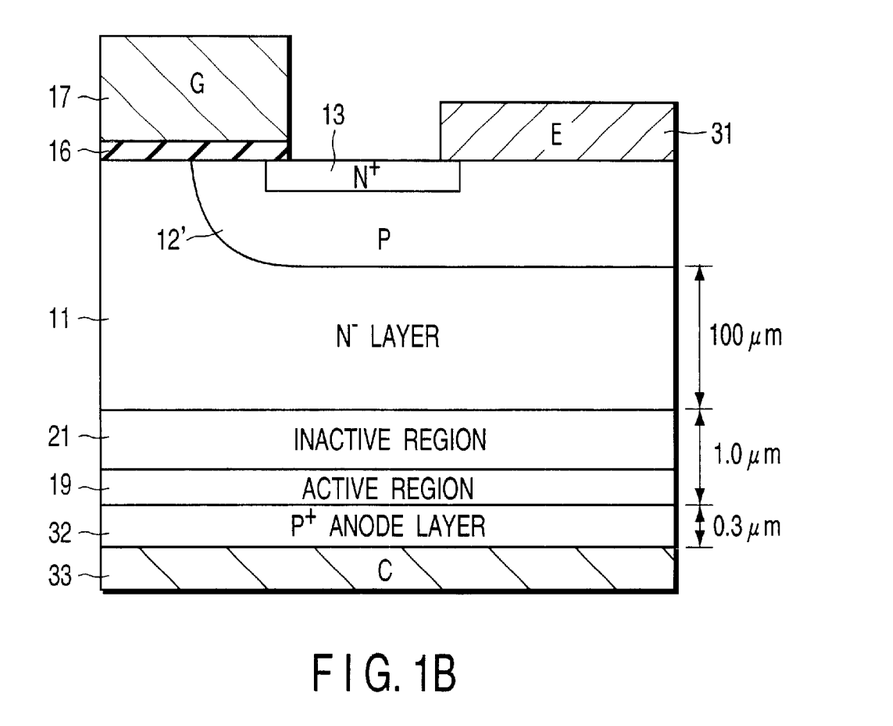
FIG. 1B is a cross-sectional view showing a planar IGBT according to the first embodiment of the present invention.

FIG. 1B is a cross-sectional view of a planar IGBT according to the first embodiment of the present invention. As FIG. 1B illustrates, a P-type diffusion layer 12' is formed on the surface of an $N^-$ layer 11, and an $N^+$-type diffusion layer 13 is selectively formed on the surface of the layer 12'. A gate electrode 17 is formed on the $N^-$ layer 11 with a gate insulation film 16 interposed therebetween. If this planar IGBT is a product having a withstanding voltage of 1200V, the thickness of the $N^-$ layer 11 is 100 μm, that of the $N^+$ buffer layer constituted of the active region 19 and inactive region 21 is 1.0 μm, and that of the $P^+$ anode layer 32 is 0.3 μm. The thickness of the $N^-$ layer 11 is the thickness from the underside of the $N^-$ layer 11 to the underside of the layer 12'. Since the other structure is the same as that of the trench IGBT, its description is omitted.

Figure 2:
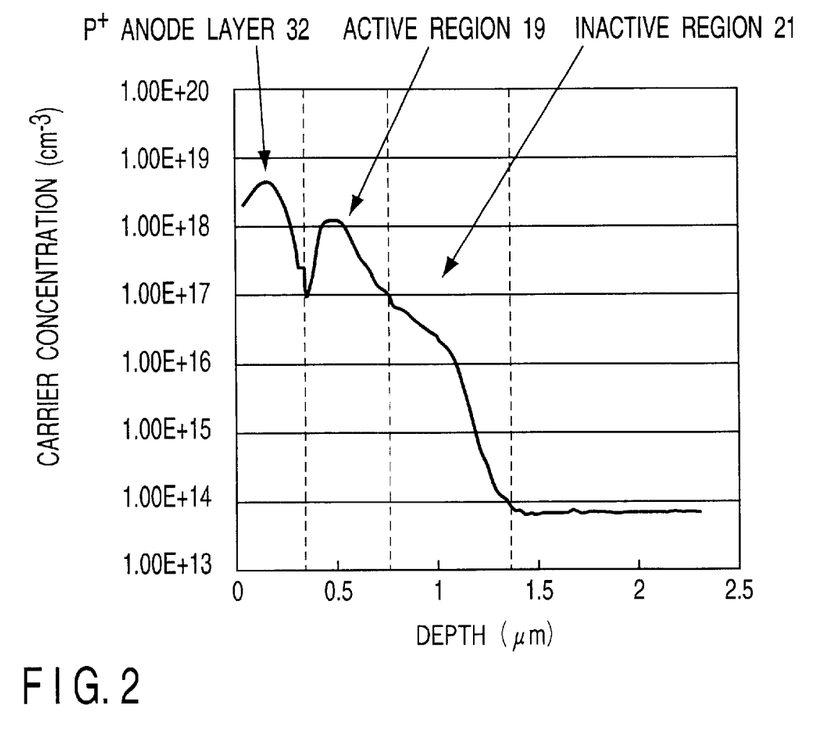
FIG. 2 is a diagram showing a relationship between the depth from the underside of a wafer and the carrier concentration in the IGBT according to the first embodiment of the present invention.

FIG. 2 shows a relationship between the depth from the underside of the wafer and the concentration of carriers. As FIG. 2 shows, the carrier concentration of the active region 19 is higher than that of the inactive region 21, while the carrier concentration of the $P^+$ anode layer 32 is higher than that of the active region 19. In other words, the carrier concentration increases toward the collector electrode 33. The carrier concentration of the underside of the $P^+$ anode layer 32 is set to $1\times10^{18}/cm^3$ or higher in order to obtain good contact of the $P^+$ anode layer 32 with the collector electrode 33 formed on the underside of the layer 32.

Figure 3:
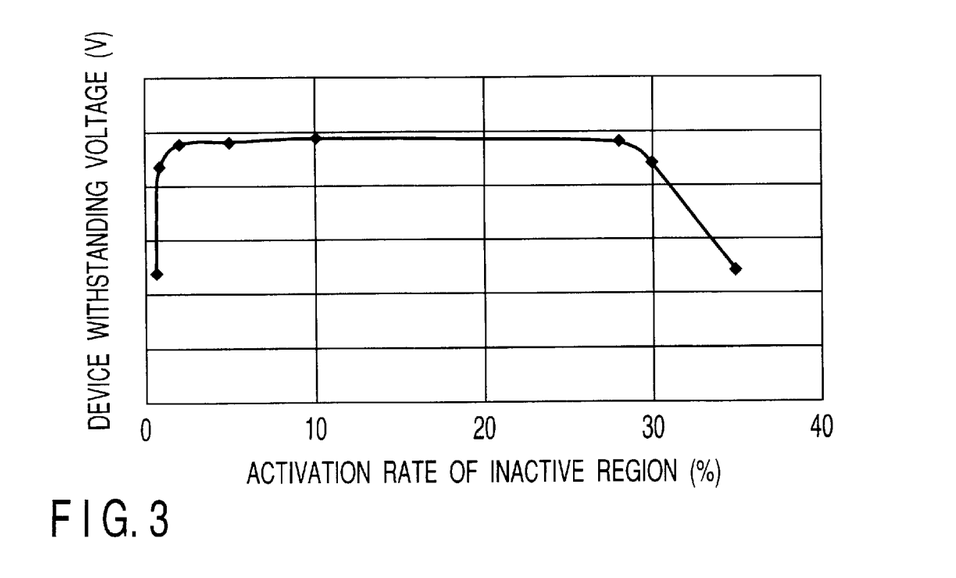
FIG. 3 is a diagram showing a relationship between the activation rate of an inactive region of the IGBT according to the first embodiment of the present invention and the withstanding voltage thereof.

FIG. 3 shows a relationship between the activation rate of the inactive region and the withstanding voltage of the device. As is seen from FIG. 3, the device decreases in withstanding voltage when the activation rate of the inactive region 21 is 1% or less. This is because the ions, which are not activated but remain when they are implanted, cause crystal defects and the crystal defects generate carriers. Even when the activation rate of the inactive region 21 is 30% or higher, the device decreases in withstanding voltage, because the field intensity varies greatly. It is thus desirable that activation rate X1 of the inactive region 21 satisfy the following expression (1), and it is the most desirable that activation rate X1 be 10%.

$$1\% \leq X1 \leq 30\% \tag{1}$$

Figure 4:
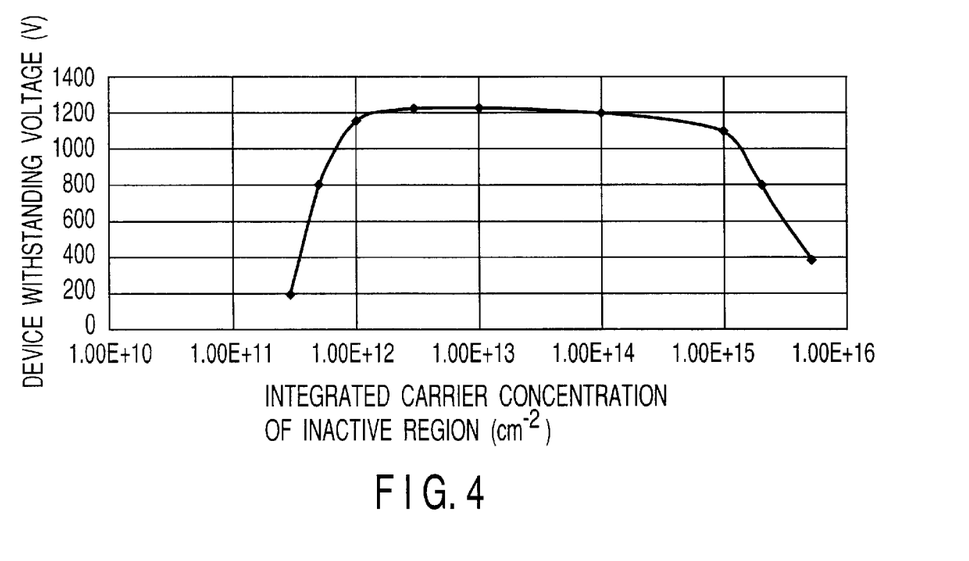
FIG. 4 is a diagram showing a relationship between the integrated carrier concentration of an inactive region of the IGBT according to the first embodiment of the present invention and the withstanding voltage thereof.

FIG. 4 shows a relationship between the integrated carrier concentration of the inactive region and the withstanding voltage of the device. The integrated carrier concentration corresponds to an amount of carrier concentration integrated in the depth direction. As is seen from FIG. 4, the integrated carrier concentration has to be $1\times10^{12}/cm^2$ or higher in order that the inactive region 21 can serve as a stopper of a depletion layer. It also has to be $1\times10^{15}/cm^2$ or lower in order that the field intensity of the inactive region 21 less varies than that of the active region 19. If, therefore, integrated carrier concentration Y of the inactive region 21 satisfies the following expression (2), the device can be prevented from decreasing in withstanding voltage.

$$1\times10^{12}/cm^2 \leq Y \leq 1\times10^{15}/cm^2 \tag{2}$$

Figure 5:
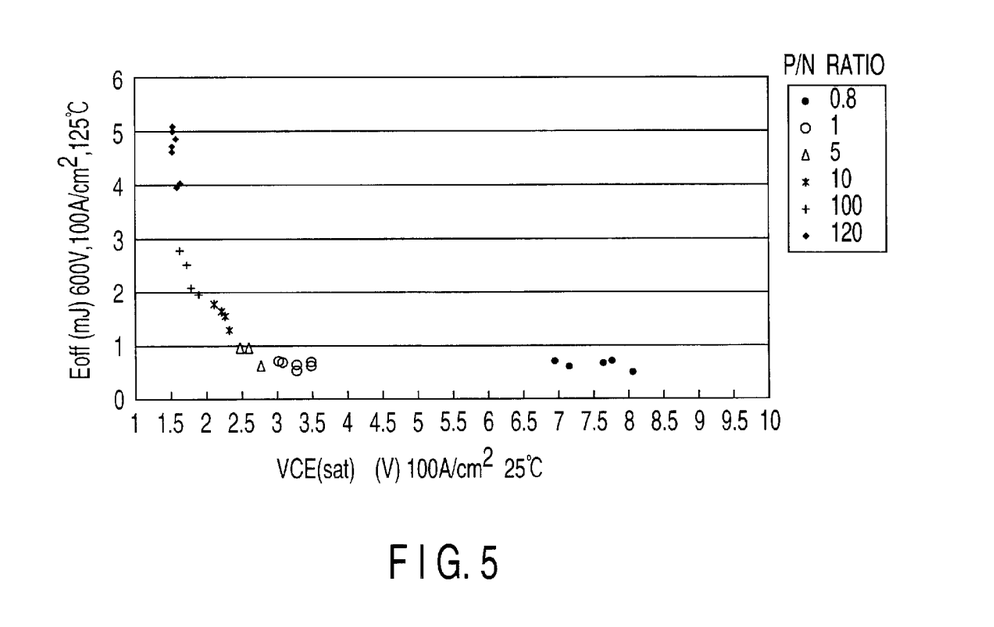
FIG. 5 is a diagram showing a correlation between a P/N ratio and a VCE(sat)-Eoff characteristic in the IGBT according to the first embodiment of the present invention.

FIG. 5 shows a correlation between a P/N ratio and a VCE(sat)-Eoff characteristic. The P/N ratio is a ratio of the concentration (P) of the P+ anode layer 32 to that (N) of the inactive region 21 when the activation rate of the inactive region 21 is 10%. The VCE(sat) is saturation voltage between the collector electrode 33 and the emitter electrode 31 when the gate on. The Eoff is an energy loss when the switch is off.

As FIG. 5 shows, the balance of concentration (P/N ratio) between the P+ anode layer 32 and the active region 19 greatly affects the VCE(sat)-Eoff characteristic. When the P/N ratio is 100 or more, VCE(sat) hardly varies but Eoff greatly increases. It is thus desirable that P/N ratio Z satisfy the following expression (3):

$$1 < Z < 100 \tag{3}$$

According to the foregoing first embodiment of the present invention, the growth of a depletion layer is suppressed by forming an N+ buffer layer of the active and inactive regions 19 and 21 having different electrical activation rates of ions.

As compared with the prior art wherein the growth of a depletion layer is suppressed by thickening the N+ buffer layer, the first embodiment of the present invention allows the N+ buffer layer to be thinned and hence power consumption can be suppressed when the switch is on.

Since the N+ buffer layer varies in carrier concentration as shown in FIG. 2, the field intensity varies gently. Consequently, it is possible to prevent carriers from being generated and thus improve the withstanding voltage of the device.

Since, moreover, an IGBT having a PT structure can be obtained using a Raw wafer, its manufacturing cost can be decreased more than that of an IGBT using an epi-wafer.

In the first embodiment, the active region 19 having a thickness of 0.4 μm serves as a first layer for preventing holes from being injected from the anode layer 32. Usually the active region necessitates having a thickness of at least 5 μm such that only the active region can suppress the injection of holes. According to the first embodiment, however, the incompletely-activated inactive region 21 is provided in contact with the active region 19, and hence the holes can be trapped with efficiency even though the active region 19 is thin. In other words, since the N+ buffer layer has a double structure of the inactive region 21 and the active region 19, the N+ buffer layer can be thinned 3 μm or less to thereby achieve an IGBT having a PT structure using a Raw wafer.

Figure 6:
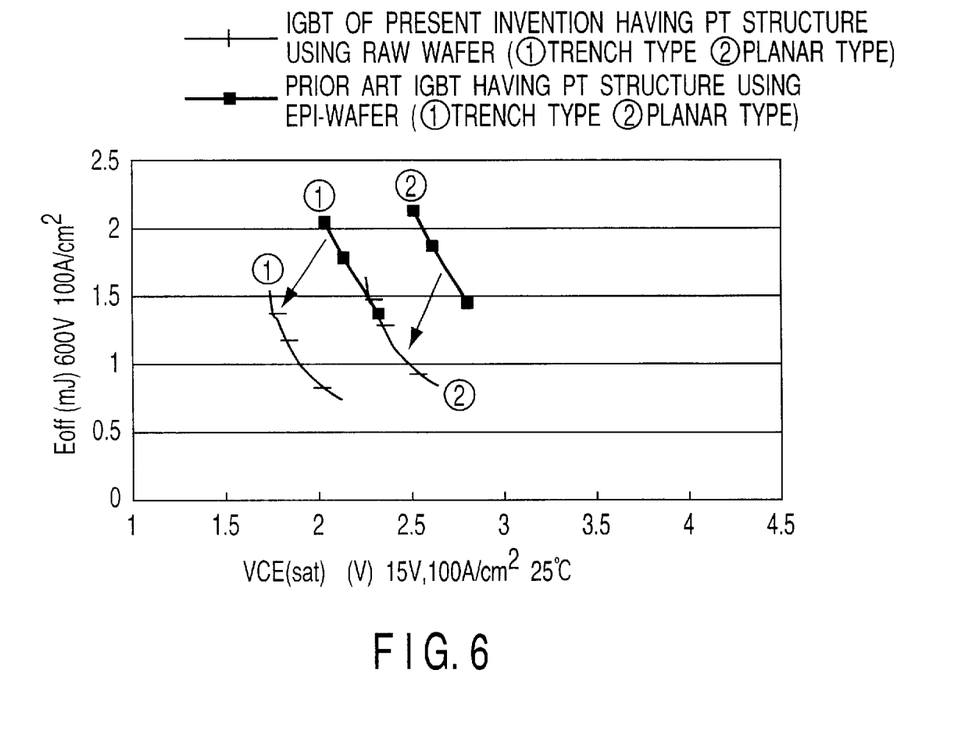
FIG. 6 is a diagram showing a VCE(sat)-Eoff characteristic in the IGBT according to the first embodiment of the present invention.

A number of crystal defects remain in the inactive region 21. The carrier lifetime (τ) in the inactive region 21 is therefore 0.1 μs or shorter, which enhances the carrier trapping effect. In the first embodiment, therefore, the VCE (sat)-Eoff characteristic can be improved more greatly than that of the prior art IGBT having a PT structure using an epi-wafer. As shown in FIG. 6, therefore, the energy loss (Eoff) can be decreased in the first embodiment.

By the above-described method, a 1200-V-withstanding-voltage IGBT whose operating voltage (VCE(sat)) was 0.5V (100 A/cm²) lower than that of the IGBT having an NPT structure, was obtained (see FIG. 6). Another 1200-V-withstanding-voltage IGBT whose VCE(sat)-Eoff characteristic was improved 30% more than that of the IGBT using an N⁻ epi-wafer, was obtained.

The method of manufacturing an IGBT is not limited to the foregoing first embodiment of the present invention. The IGBT can be produced by the following method.

As in the first embodiment described above, the surface structure of a wafer is formed and then the underside of the wafer is polished in accordance with the withstanding voltage of the device. Phosphorus is ion-implanted into the underside of the wafer at an acceleration voltage of 200 keV and a dose of $1\times10^{14}/cm^2$ and then boron is ion-implanted thereinto at an acceleration voltage of 50 keV and a dose of $1\times10^{15}/cm^2$. After that, the laser annealing thermally treats the resultant structure to activate the ions. By controlling the conditions of the laser annealing, a well-activated P+ anode layer 32 having a thickness of 0.3 μm, an active region 19 having a thickness of about 0.4 μm, and an inactive region 21 whose activation rate is about 10%, are simultaneously formed on the underside of the wafer. A collector electrode 33 of a metal film is then formed on the underside of the P+ anode layer 32.

This method can also produce the same advantages as those of the first embodiment. Furthermore, the number of ion implantations is smaller than that in the first embodiment, so that the number of manufacturing steps can be reduced. Since, moreover, damage caused to the surface of the wafer can be decreased, the yield can be improved.

[Second Embodiment]

The second embodiment of the present invention is directed to a power MOSFET having a PT structure using a Raw wafer and, like the first embodiment, it is characterized in that the power MOSFET has two N+ buffer layers having different carrier concentrations. In the second embodiment, the same constituting elements as those of the first embodiment are indicated by the same reference numerals.

Figure 7A:
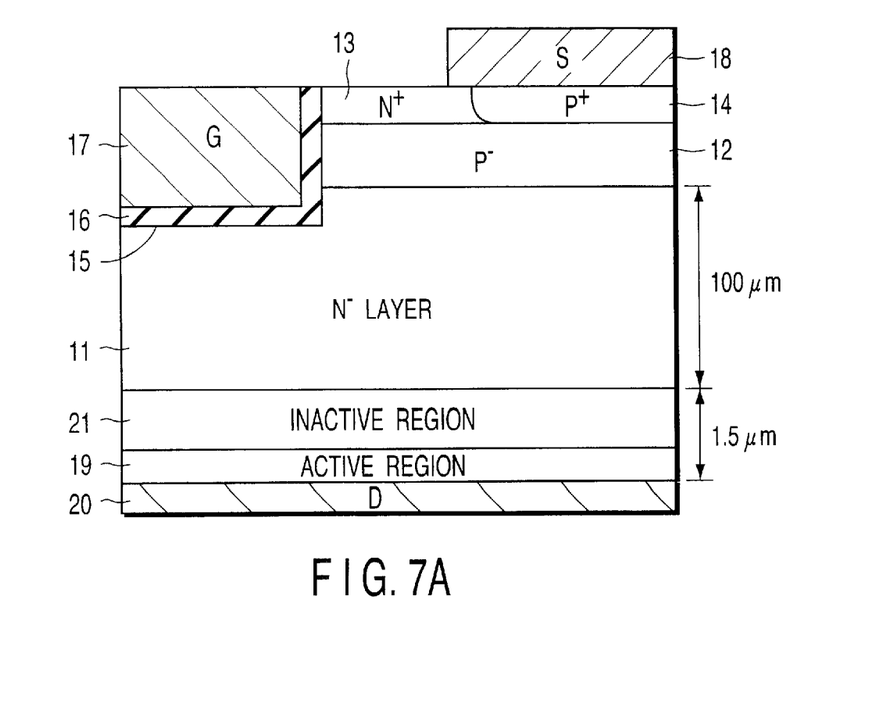
FIG. 7A is a cross-sectional view showing a trench power MOSFET according to a second embodiment of the present invention.

FIG. 7A is a cross-sectional view of a trench power MOSFET according to the second embodiment of the present invention. Referring to FIG. 7A, a method of manufacturing the power MOSFET will be discussed.

First, a P⁻-type diffusion layer 12 is formed on the surface of an N⁻-type silicon substrate 11 (referred to as an N⁻ layer hereinafter) serving as a Raw wafer, and an N+-type diffusion layer 13 and a P+-type diffusion layer 14 are selectively formed on the surface of the layer 12. Then, a trench 15 is formed to such a depth as to reach the N⁻ layer 11. A gate insulation film 16 is formed on the entire surface of the resultant structure, and a metal film is formed on the gate insulation film 16. After that, both the gate insulation film 16 and the metal film are selectively removed, and a gate electrode 17 is formed by the gate insulation film 16 in the trench 15. Then, a source electrode 18, which is electrically insulated from the gate electrode 17, is selectively formed above the N⁻ layer 11. The formation of the surface structure of the wafer is thus completed.

The underside of the wafer is polished to have a given thickness corresponding to a withstanding voltage of the device. In order to set the withstanding voltage of the device to, e.g., 1200V, the underside of the wafer is polished such that the N⁻ layer 11 has a thickness of 100 μm.

Phosphorus is ion-implanted into the underside of the wafer at an acceleration voltage of 50 keV and a dose of $1 \times 10^{14}/\text{cm}^2$. Then, the resultant structure is thermally treated at a temperature of 900° C. by RTA to activate the ions. Thus, an activated N⁺ buffer layer 19 having a thickness of 0.5 μm (referred to as an active region hereinafter) is formed on the underside of the N⁻ layer 11. The activation rate of the active region 19 need not be 100% but can be about 70%, for example.

Phosphorus is then ion-implanted into the underside of the wafer at an acceleration voltage of 300 keV and a dose of $1 \times 10^{14}/\text{cm}^2$. A drain electrode 20, which is made of a metal film, is formed on the underside of the active region 19. After that, the resultant structure is thermally treated at a temperature of 500° C. to activate the ions. Thus, an incompletely-activated N⁺ buffer layer 21 (referred to as an inactive region hereinafter) is formed between the N⁻ layer 11 and the active region 19. The electrical activation rate of ions in the inactive region 21 is about 10%, for example.

The thickness of an N⁺ buffer layer constituted of the active region 19 and the inactive region 21 is about 1.5 μm. In contrast, in the conventional PT structure using a Raw wafer, the thickness of the N⁺ buffer layer is 5 μm or more. In other words, the second embodiment allows the N⁺ buffer layers 19 and 21 to be thinned more greatly than the conventional PT structure using a Raw wafer. The N⁺ buffer layers 19 and 21 of the second embodiment can thus be formed by heat treatment in a short time. Even though the underside of the wafer is heat-treated after the surface structure thereof is formed, no heat damage is caused to the surface of the wafer. If the total thickness of the N⁺ buffer layers is 3.0 μm or less, no heat damage is caused to the surface of the wafer. Since the heat treatment is executed in order to form the inactive region 21 after the drain electrode 20 is formed, good contact of the active region 19 with the drain electrode 20 can be obtained.

The power MOSFET according to the second embodiment is not limited to a trench gate electrode but can be a planar gate electrode.

Figure 7B:
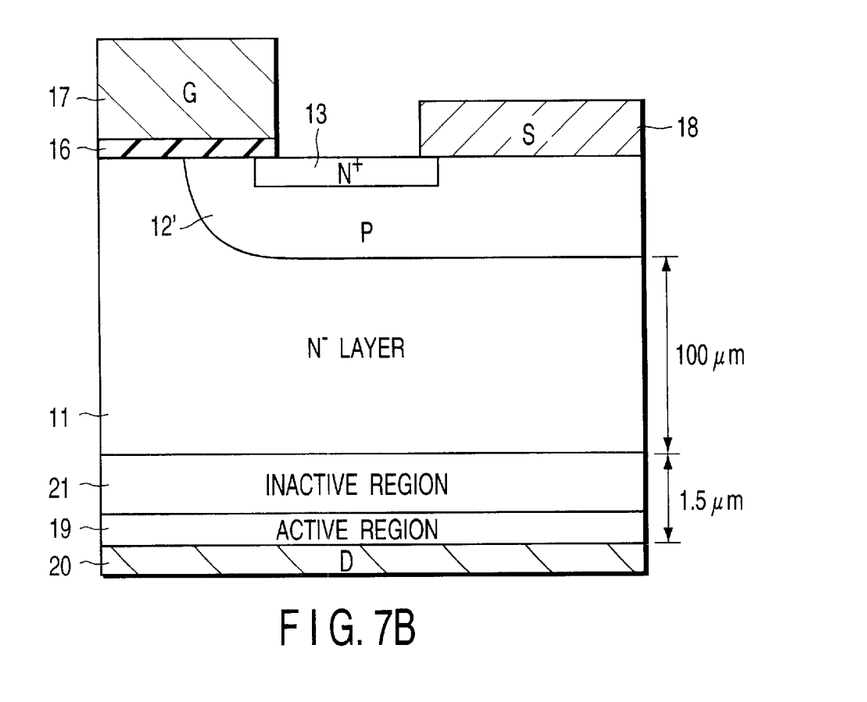
FIG. 7B is a cross-sectional view showing a planar power MOSFET according to the second embodiment of the present invention.

FIG. 7B is a cross-sectional view of a planar power MOSFET according to the second embodiment of the present invention. As FIG. 7B illustrates, a P-type diffusion layer 12' is formed on the surface of an N⁻ layer 11, and an N⁺-type diffusion layer 13 is selectively formed on the surface of the layer 12'. A gate electrode 17 is formed on the N⁻ layer 11 with a gate insulation film 16 interposed therebetween. If this planar power MOSFET is a product having a withstanding voltage of 1200V, the thickness of the N⁻ layer 11 is 100 μm, and that of the N⁺ buffer layer constituted of the active region 19 and inactive region 21 is 1.5 μm. The thickness of the N⁻ layer 11 is the thickness from the underside of the N⁻ layer 11 to the underside of the layer 12'. Since the other structure is the same as that of the trench power MOSFET, its description is omitted.

Figure 8:
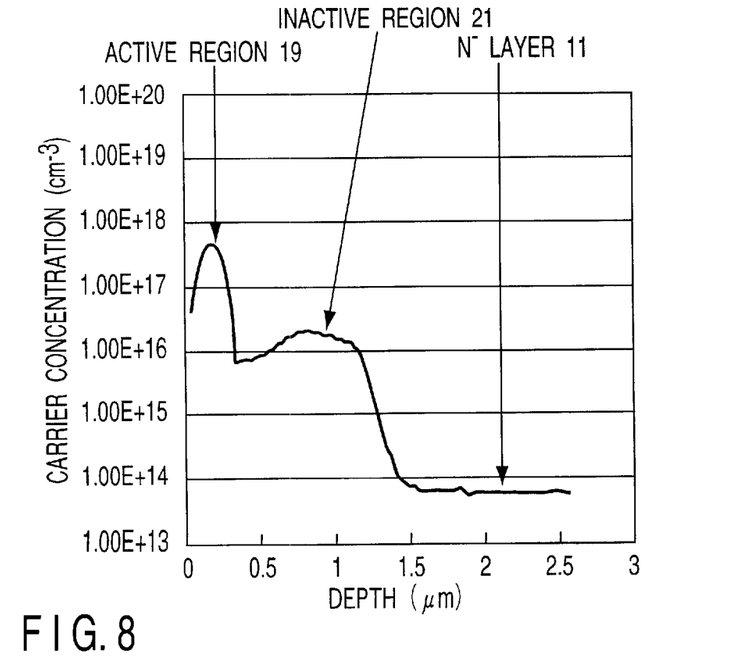
FIG. 8 is a diagram showing a relationship between the depth from the underside of a wafer and the carrier concentration in the power MOSFET according to the second embodiment of the present invention.

FIG. 8 shows a relationship between the depth from the underside of the wafer and the concentration of carriers. As FIG. 8 shows, the carrier concentration of the active region 19 is higher than that of the inactive region 21, while the carrier concentration of the inactive region 21 is higher than that of the N⁻ layer 11. In other words, the carrier concentration increases toward the drain electrode 20. The carrier concentration of the underside of the active region 19 is set to $3 \times 10^{17}/\text{cm}^3$ or higher in order to obtain good contact of the active region 19 with the drain electrode 20 formed on the underside of the active region 19.

Figure 9:
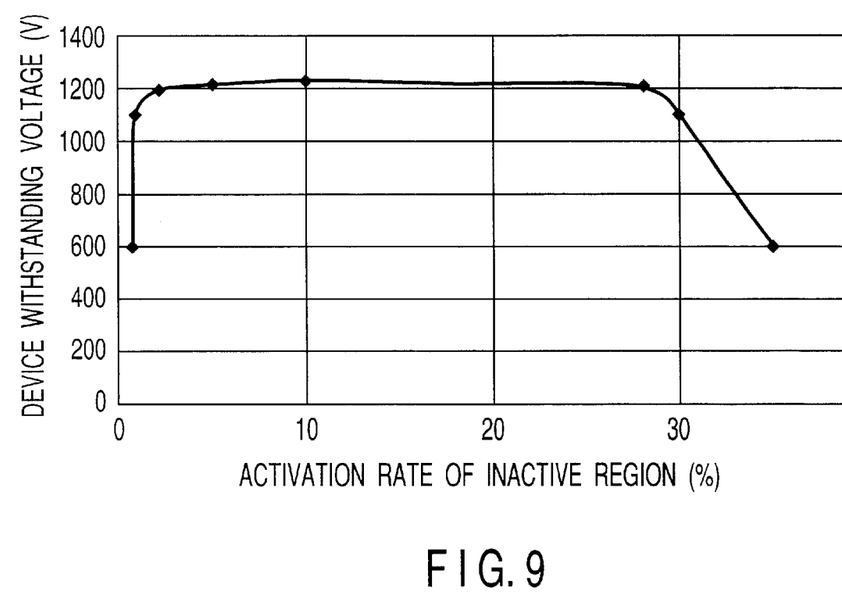
FIG. 9 is a diagram showing a relationship between the activation rate of an inactive region of the power MOSFET according to the second embodiment of the present invention and the withstanding voltage thereof.

FIG. 9 shows a relationship between the activation rate of the inactive region and the withstanding voltage of the device. As is seen from FIG. 9, the device decreases in withstanding voltage when the activation rate of the inactive region 21 is 1% or less. This is because the ions, which are not activated but remain when they are implanted, cause crystal defects and the crystal defects generate carriers. Even when the activation rate is 30% or higher, the element decreases in withstanding voltage, because the field intensity varies greatly when a withstanding voltage is applied. It is thus desirable that activation rate X2 of the inactive region 21 satisfy the following expression (4), and it is the most desirable that activation rate X2 be 10%.

$$1\% \leq X2 \leq 30\% \tag{4}$$

Figure 10:
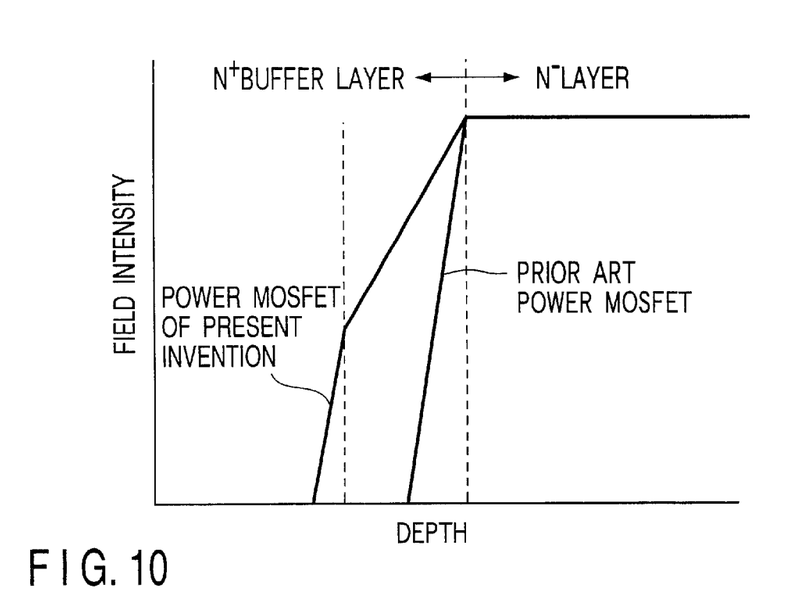
FIG. 10 is a diagram showing a relationship between the depth of a substrate and the field intensity when a withstanding voltage is applied to the power MOSFET according to the second embodiment of the present invention.

FIG. 10 shows a relationship between the depth of the substrate and variations in field intensity when a withstanding voltage is applied. In a withstanding voltage is applied state (in a switch-off state of the gate withstanding voltage-off), a depletion layer expands from the N⁻ layer 11 to the inactive region 21 as the applied voltage increases. As is seen from FIG. 8, the carrier concentration of the inactive region 21 is higher than that of the N⁻ layer 11 and the carrier concentration of the active region 19 is higher than that of the inactive region 21. The expansion of the depletion layer is therefore suppressed gradually, with the result that, as shown in FIG. 10, the field intensity of the power MOSFET of the second embodiment varies more gently than that of the conventional power MOSFET.

In the second embodiment, too, it is desirable that integrated carrier concentration Y of the inactive region 21 satisfy the following expression:

$$1 \times 10^{12}/\text{cm}^2 \leq Y \leq 1 \times 10^{15}/\text{cm}^2 \qquad \text{(see FIG. 4)}.$$

According to the second embodiment described above, the growth of a depletion layer is suppressed by forming an N⁺ buffer layer of the active and inactive regions 19 and 21 having different electrical activation rates of ions.

As compared with the prior art wherein the growth of a depletion layer is suppressed by thickening the N⁺ buffer layer, the second embodiment of the present invention allows the N⁺ buffer layer to be thinned and hence power consumption can be suppressed when the switch is on.

Since the N⁺ buffer layer varies in carrier concentration as shown in FIG. 8, the field intensity varies gently as shown in FIG. 10. Consequently, it is possible to prevent carriers from being generated and thus improve the withstanding voltage of the device.

Since, moreover, a power MOSFET having a PT structure can be realized using a Raw wafer, its manufacturing cost can be decreased more than that of a power MOSFET using an epi-wafer.

With the above second embodiment, a power MOSFET of a high withstanding voltage type of 500V or higher, which has been considered to be difficult to form by a completely-activated N⁺ buffer layer having a thickness of 3 μm, can be achieved.

[Third Embodiment]

The third embodiment of the present invention is directed to a power MOSFET having a PT structure in which only the inactive region suppresses the expansion of a depletion layer without any active region as described in the above second embodiment. In the third embodiment, the description of the same structure as that of the second embodiment is omitted and only the structure different therefrom will be explained. The same constituting elements as those of the second embodiment are denoted by the same reference numerals.

Figure 11A:
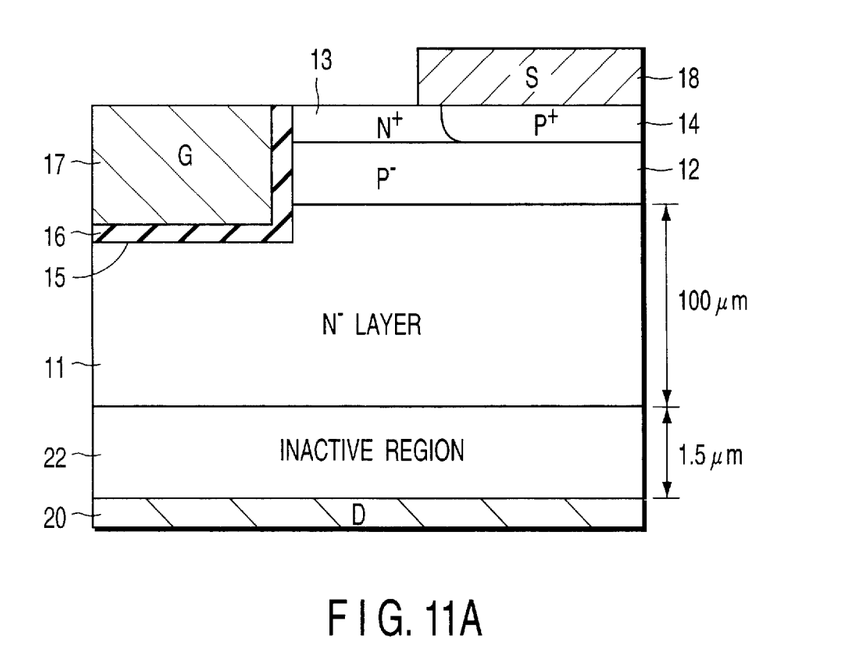
FIG. 11A is a cross-sectional view showing a trench power MOSFET according to a third embodiment of the present invention.

FIG. 11A is a cross-sectional view of a trench power MOSFET according to the third embodiment. Referring to FIG. 11A, a method of manufacturing the power MOSFET will be discussed.

First, the surface structure of a wafer is formed as in the second embodiment, and then the underside of the wafer is polished to have a given thickness corresponding to a withstanding voltage of the device. In order to set the withstanding voltage of the device to, e.g., 1200V, the underside of the wafer is polished such that the N⁻ layer 11 has a thickness of 100 μm.

Phosphorus is ion-implanted into the underside of the wafer at an acceleration voltage of 50 kev and a dose of $1 \times 10^{14}/cm^2$. Then, a drain electrode 20 of a metal film is formed on the underside of the wafer. After that, the resultant structure is thermally treated at a temperature of 500° C. to activate the ions. Thus, an incompletely-activated N⁺ buffer layer 22 (referred to as an inactive region hereinafter) is formed between the N⁻ layer 11 and the drain electrode 20. The ion activation rate of the inactive region 22 is about 10%, for example. The thickness of the inactive region 22 is about 1.5 μm. If the thickness of the inactive region 22 is 3.0 μm or less, no heat damage is caused to the surface of the wafer.

The power MOSFET according to the third embodiment is not limited to a trench gate electrode but can be a planar gate electrode.

Figure 11B:
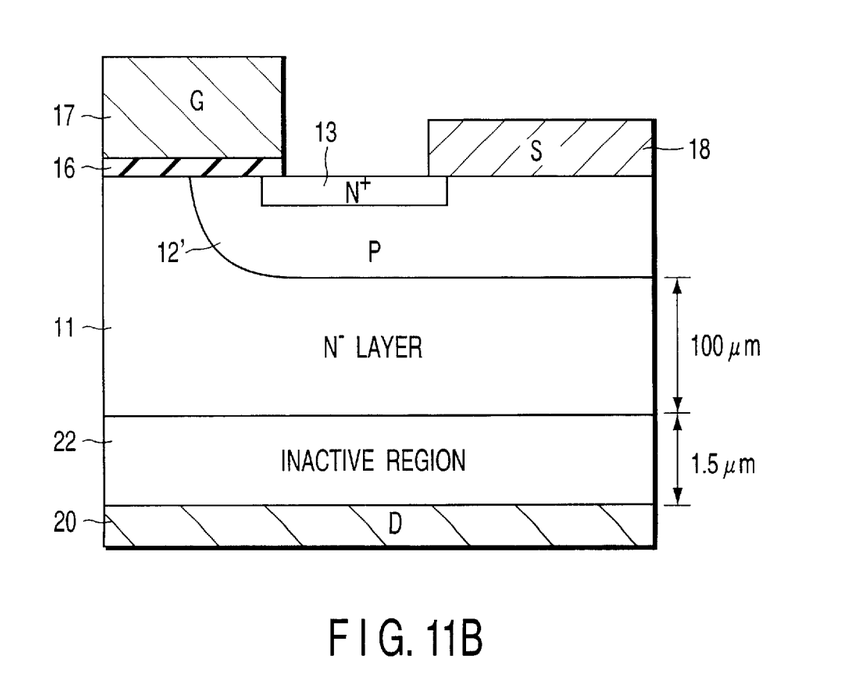
FIG. 11B is a cross-sectional view showing a planar power MOSFET according to the third embodiment of the present invention.

FIG. 11B is a cross-sectional view of a planar power MOSFET according to the third embodiment. As FIG. 11B illustrates, a P-type diffusion layer 12' is formed on the surface of an N⁻ layer 11, and an N⁺-type diffusion layer 13 is selectively formed on the surface of the layer 12'. A gate electrode 17 is formed on the N⁻ layer 11 with a gate insulation film 16 interposed therebetween. If this planar power MOSFET is a product having a withstanding voltage of 1200V, the thickness of the N⁻ layer 11 is 100 μm and that of the inactive region 22 is 1.5 μm. The thickness of the N⁻ layer 11 is the thickness from the underside of the N⁻ layer 11 to the underside of the layer 12'. Since the other structure is the same as that of the trench power MOSFET, its description is omitted.

The same advantage as that of the second embodiment can be obtained from the third embodiment. In the third embodiment, only the inactive region 22 allows the N⁺ buffer layer to be formed. The number of manufacturing steps is therefore smaller than that of the second embodiment; hence, the power MOSFET having a PT structure can easily be manufactured.

The present invention is not limited to a two-layered N⁺ buffer layer as described in the first and second embodiments. If it is possible to form an N⁺ buffer layer whose carrier concentration increases toward the underside of the wafer without causing heat damage to the surface structure of the wafer, the N⁺ buffer layer can be constituted of whatever number of layers.

The present invention aims at manufacturing a device having a withstanding voltage of 1200V. Various numeric values such as the thickness of the N⁺ buffer layer and the conditions of ion implantation vary with a change in the withstanding voltage of the device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first diffusion region of a second conductivity type formed on a surface of a semiconductor substrate of a first conductivity type;
   a second diffusion region of the first conductivity type selectively formed on a surface of the first diffusion region;
   a gate electrode formed in or on the semiconductor substrate with a gate insulation film interposed therebetween;
   an emitter electrode electrically insulated from the gate electrode and selectively formed on the semiconductor substrate;
   an inactive region of the first conductivity type formed on an underside of the semiconductor substrate, the inactive region having incompletely activated ions;
   an active region of the first conductivity type formed on an underside of the inactive region, the active region having highly activated ions;
   an anode layer of the second conductivity type formed on an underside of the active region; and
   a collector electrode formed on an underside of the anode layer.

2. The semiconductor device according to claim 1, wherein an electrical activation rate X of the ions of the inactive region is expressed as 1%≦X≦30%.

3. The semiconductor device according to claim 1, wherein an integrated carrier concentration Y of the inactive region is expressed as $1 \times 10^{12}/cm^2 \leq Y \leq 1 \times 10^{15}/cm^2$.

4. The semiconductor device according to claim 1, wherein a carrier concentration of the active region is higher than that of the inactive region, and a carrier concentration of the anode layer is higher than that of the active region.

5. The semiconductor device according to claim 1, wherein a total thickness of the inactive region and the active region is 3.0 μm or less.

6. The semiconductor device according to claim 1, wherein a ratio Z of carrier concentration of the anode layer to that of the active region is given by 1<Z<100.

7. The semiconductor device according to claim 1, wherein a carrier concentration of a surface area of the anode layer, which contacts the collector electrode, is $1 \times 10^{18}/cm^3$ or higher.

8. The semiconductor device according to claim 1, wherein the inactive region has a higher impurity concentration than the semiconductor substrate.

9. A semiconductor device comprising:
   a first diffusion region of a second conductivity type formed on a surface of a semiconductor substrate of a first conductivity type;
   a second diffusion region of the first conductivity type selectively formed on a surface of the first diffusion region;

a gate electrode formed in or on the semiconductor substrate with a gate insulation film interposed therebetween;

a source electrode electrically insulated from the gate electrode and selectively formed on the semiconductor substrate;

an inactive region of the first conductivity type formed on an underside of the semiconductor substrate, the inactive region having incompletely activated ions and a higher impurity concentration than the semiconductor substrate;

an active region of the first conductivity type formed on an underside of the inactive region, the active region having highly activated ions; and a drain electrode formed on an underside of the active region.

10. The semiconductor device according to claim 9, wherein an electrical activation rate X of the ions of the inactive region is expressed as $1\% \leq X \leq 30\%$.

11. The semiconductor device according to claim 9, wherein an integrated carrier concentration Y of the inactive region is expressed as $1 \times 10^{12}/cm^2 \leq Y \leq 1 \times 10^{15}/cm^2$.

12. The semiconductor device according to claim 9, wherein a carrier concentration of the active region is higher than that of the inactive region.

13. The semiconductor device according to claim 9, wherein a total thickness of the inactive region and the active region is 3.0 μm or less.

14. The semiconductor device according to claim 9, wherein a carrier concentration of a surface area of the active region, which contacts the drain electrode, is $3 \times 10^{17}/cm^3$ or higher.

15. A semiconductor device comprising:

a first diffusion region of a second conductivity type formed on a surface of a semiconductor substrate of a first conductivity type;

a second diffusion region of the first conductivity type selectively formed on a surface of the first diffusion region;

a gate electrode formed in or on the semiconductor substrate with a gate insulation film interposed therebetween;

a source electrode electrically insulated from the gate electrode and selectively formed on the semiconductor substrate;

an inactive region of the first conductivity type formed on an underside of the semiconductor substrate, the inactive region having incompletely activated ions and a higher impurity concentration than the semiconductor substrate; and a drain electrode formed on an underside of the inactive region.

16. The semiconductor device according to claim 15, wherein an electrical activation rate X of the ions of the inactive region is expressed as $1\% \leq X \leq 30\%$.

17. The semiconductor device according to claim 15, wherein an integrated carrier concentration Y of the inactive region is expressed as $1 \times 10^{12}/cm^2 \leq Y \leq 1 \times 10^{15}/cm^2$.

18. The semiconductor device according to claim 15, wherein the inactive region has a thickness of 3.0 μm or less.

19. A method of manufacturing a semiconductor device, comprising the steps of:

forming a first diffusion region of a second conductivity type on a surface of a semiconductor substrate of a first conductivity type;

selectively forming a second diffusion region of the first conductivity type on a surface of the first diffusion region;

forming a gate electrode in or on the semiconductor substrate with a gate insulation film interposed therebetween;

selectively forming an emitter electrode on the semiconductor substrate;

polishing an underside of the semiconductor substrate;

forming an active region of the first conductivity type on the underside of the semiconductor substrate and an anode layer of the second conductivity type on an underside of the active region by heat treatment after ions are implanted into the underside of the semiconductor substrate, the active region having highly activated ions;

forming a collector electrode on an underside of the anode layer after the ions are implanted into the underside of the semiconductor substrate; and forming an inactive region of the first conductivity type between the semiconductor substrate and the active region by heat treatment, the inactive region having incompletely activated ions.

20. The method of manufacturing a semiconductor device according to claim 19, wherein an electrical activation rate X of the ions of the inactive region is given by $1\% \leq X \leq 30\%$.

21. The method of manufacturing a semiconductor device according to claim 19, wherein an integrated carrier concentration Y of the inactive region is given by $1 \times 10^{12}/cm^2 \leq Y \leq 1 \times 10^{15}/cm^2$.

22. The method of manufacturing a semiconductor device according to claim 19, wherein the active region has a higher carrier concentration than the inactive region, and the anode layer has a higher carrier concentration than the active region.

23. The method of manufacturing a semiconductor device according to claim 19, wherein a total thickness of the inactive region and the active region is 3.0 μm or less.

24. The method of manufacturing a semiconductor device according to claim 19, wherein a ratio Z of a carrier concentration of the anode layer to that of the active region is given by $1 < Z < 100$.

25. The method of manufacturing a semiconductor device according to claim 19, wherein a carrier concentration of a surface area of the anode layer, which is in contract with the collector electrode, is $1 \times 10^{18}/cm^3$ or higher.

* * * * *